(12) United States Patent
Ishikawa et al.

(10) Patent No.: US 11,169,876 B2
(45) Date of Patent: Nov. 9, 2021

(54) APPARATUSES, SYSTEMS, AND METHODS FOR ERROR CORRECTION

(71) Applicant: MICRON TECHNOLOGY, INC., Boise, ID (US)

(72) Inventors: Toru Ishikawa, Sagamihara (JP); Minari Arai, Niiza (JP)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 16/748,595

(22) Filed: Jan. 21, 2020

(65) Prior Publication Data

US 2021/0200630 A1 Jul. 1, 2021

Related U.S. Application Data

(60) Provisional application No. 62/955,869, filed on Dec. 31, 2019.

(51) Int. Cl.
*G06F 11/10* (2006.01)
*G11C 11/408* (2006.01)
*G11C 11/4096* (2006.01)

(52) U.S. Cl.
CPC ...... *G06F 11/1068* (2013.01); *G06F 11/1032* (2013.01); *G06F 11/1044* (2013.01); *G11C 11/4085* (2013.01); *G11C 11/4087* (2013.01); *G11C 11/4096* (2013.01)

(58) Field of Classification Search
CPC .................................................. G06F 11/1068
USPC ....................................................... 714/764
See application file for complete search history.

(56) References Cited

U.S. PATENT DOCUMENTS

| 6,104,657 | A | 8/2000 | Haga | |
| 6,604,222 | B1 * | 8/2003 | Jensen | H03M 13/17 |
| | | | | 714/785 |
| 6,851,081 | B2 * | 2/2005 | Yamamoto | G06F 11/1008 |
| | | | | 714/6.2 |
| 7,562,198 | B2 * | 7/2009 | Noda | G11C 7/1006 |
| | | | | 711/154 |
| 10,409,675 | B2 | 9/2019 | Suzuki | |

(Continued)

FOREIGN PATENT DOCUMENTS

KR 20130101976 A 9/2013

OTHER PUBLICATIONS

International Search Report and Written Opinion for PCT Application No. PCT/US2021/014224, dated May 3, 2021, pp. all.

*Primary Examiner* — Fritz Alphonse
(74) *Attorney, Agent, or Firm* — Dorsey & Whitney LLP

(57) ABSTRACT

Apparatuses, systems, and methods for error correction. A memory device may have a number of memory cells each of which stores a bit of information. One or more error correction code (ECC) may be used to determine if the bits of information contain any errors. To mitigate the effects of failures of adjacent memory cells, the information may be divided into a first group and a second group, where each group contains information from memory cells which are non-adjacent to other memory cells of that group. Each group of information may include data bits and parity bits used to correct those data bits. For example, as part of a read operation, a first ECC circuit may receive information from even numbered memory cells, while a second ECC circuit may receive information from odd numbered memory cells.

20 Claims, 9 Drawing Sheets

(56) References Cited

U.S. PATENT DOCUMENTS

| | | | |
|---|---|---|---|
| 2002/0013924 A1* | 1/2002 | Yamamoto | G06F 11/1008 |
| | | | 714/763 |
| 2007/0277066 A1* | 11/2007 | Gajapathy | G06F 11/1044 |
| | | | 714/724 |
| 2010/0257429 A1 | 10/2010 | Noguchi | |
| 2011/0252288 A1* | 10/2011 | Sharon | G06F 11/1048 |
| | | | 714/758 |
| 2013/0117602 A1 | 5/2013 | Kim et al. | |
| 2013/0173970 A1* | 7/2013 | Kleveland | G11C 29/808 |
| | | | 714/710 |
| 2013/0238959 A1 | 9/2013 | Birk et al. | |

* cited by examiner

APPARATUSES, SYSTEMS, AND METHODS FOR ERROR CORRECTION

CROSS-REFERENCE TO RELATED APPLICATION(S)

This application claims the benefit under 35 U.S.C. § 119 of the earlier filing date of U.S. Provisional Application Ser. No. 62/955,869 filed Dec. 31, 2019, the entire contents of which are hereby incorporated by reference in their entirety for any purpose.

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

DETAILED DESCRIPTION

Figure 1:
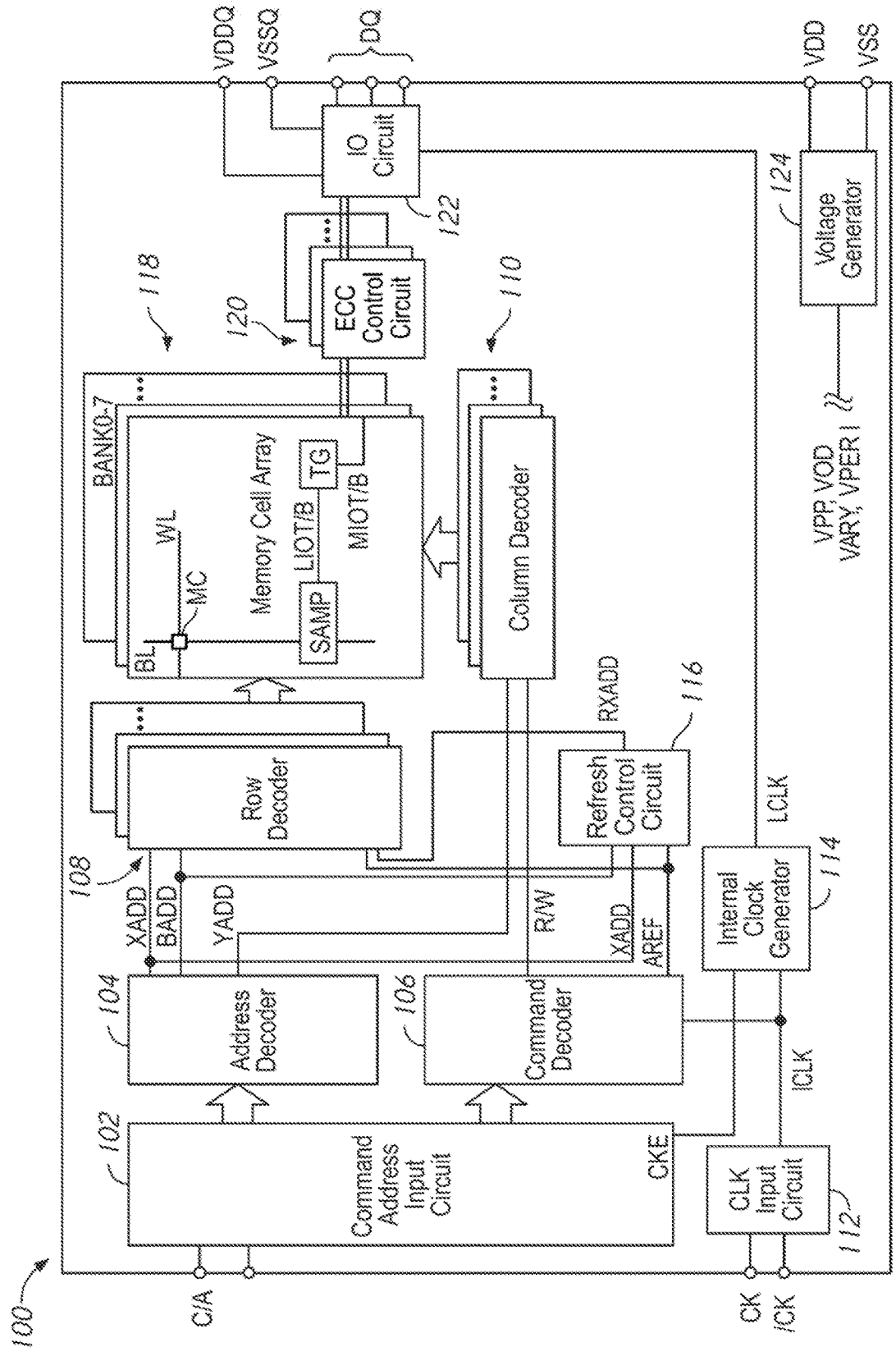
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of die present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the an so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include i data bits and k parity bits, which may be used to correct up to j of the data bits. During a write operation the parity bits may be generated by an error correction circuit based on the data written to the memory cells of the row. During a read operation the error correction circuit may use the parity bits to determine if the read data bits are correct, and may correct any errors which are found.

In some examples, data may be organized based on a number of data bits and parity bits which can correct up to a single error in the data bits. For example, if a group of data, such as the data saved along a row, includes 128 data bits and 8 parity bits, the 8 parity bits may be used to identify and correct up to one error among the 128 data bits. Accordingly, if the 128 data bits include two or more errors then the error correction circuit may not be able to correct the errors in the 128 data bits. One way in which multiple bits can fail is if there is a defect in the chip which affects two memory cells which are adjacent to each other (e.g., two memory cells along the same row, but coupled to adjacent digit lines). It may be useful to organize the manner in which memory cells are coupled to the error correction circuits to allow the memory to mitigate the effects of adjacent errors.

The present disclosure is directed to apparatuses, systems, and methods for error correction. The memory device may divide information along a row such that no two adjacent bits of information are read out to the same error correction circuit at the same time. For example, digit lines may alternate between 'even' and 'odd' digit lines and the even digit lines may be coupled to a first error correction circuit while the odd digit lines are coupled to a second error correction circuit. Each of the first and the second error correction circuit may be able to correct up to a single bit of error. If a pair of adjacent bits fail, then one of the failed bits will end up read out to the first error correction circuit, while the other of the failed bits will end up read out to the second error correction circuit. In this manner, both bits may be corrected, since each error correction circuit receives one of the two adjacent failed bits. In some embodiments, information may be read serially from groups including non-adjacent memory cells (e.g. data may be read first from even digit lines then from odd word lines) to reduce the number of error correction circuits which are required.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data. The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into die memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118. As part of a given access operation, each ECC control circuit 120 may be responsible for reading/writing data to memory cells of the memory array 118 which are not adjacent to each other. For example, when a row is activated and data is coupled between a portion of the memory cells of the activated row and an ECC control circuit 120, between all of the memory cells coupled to the ECC circuit 120 there may be at least one other memory cell which is not coupled to that ECC circuit 120.

In some embodiments, different groups of data (and parity bits) may be provided to (or read from) non-adjacent memory cells in parallel. For example, a first ECC control circuit 120 may handle one first group of memory cells, while a second ECC control circuit 120 handles a second group of memory cells. Memory cells in the first group of memory cells are not adjacent to other memory cells in the first group of memory cells, and memory cells in the second group of memory cells are not adjacent to other memory cells of the second group of memory cells, although memory cells of the first group may be adjacent to memory cells of the second group. For example, an 'even' ECC control circuit may handle memory cells coupled to even numbered digit lines, while an 'odd' ECC control circuit may handle memory cells coupled to odd numbered digit lines.

In some embodiments, different groups of data (and parity bit) may be provided to (or read from) non-adjacent memory cells sequentially. Memory cells in the first group of memory cells are not adjacent to other memory cells in the first group of memory cells, and memory cells in the second group of memory cells are not adjacent to other memory cells of the second group of memory cells, although memory cells of the first group may be adjacent to memory cells of the second group. For example, an ECC control circuit may handle a first group of memory cells as part of a first access operation, and then handle a second group of memory cells as part of a second access operation. Although sequential embodiments may be described in a certain order (e.g., even then odd), it should be understood that any of the embodiments described herein may be used in the other order (e.g., odd then even). In some embodiments, a single ECC control circuit may be used for multiple groups of non-adjacent memory cells in this fashion.

In some embodiments, multiple word lines may be activated, and written to/read out to an ECC control circuit 120. For example, a first group of memory cells may be along a first word line while a second group of memory cells may be along a second word line. Memory cells in the first group of memory cells are not adjacent to other memory cells in the first group of memory cells, and memory cells in the second group of memory cells are not adjacent to other memory cells of the second group of memory cells. For example, memory cells coupled to even numbered digit lines on a first word line and memory cells coupled to odd numbered digit lines on a second word line may be managed by an ECC circuit.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. For example, the ECC control circuit 120 may be able to locate and correct up to one error in the 128 data bits based on the 8 parity bits. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 9.

In some embodiments, the device 100 may operate in different modes, which may, in part, determine how the ECC control circuits 120 are coupled to the memory cells MC of the memory array 118. In some embodiments, the different modes may determine how many of the DQ pads are used as part of a given access operation. For example, as part of an x16 operation mode, 16 different DQ pads may be used. Data may be burst-written to the memory with each pad receiving a burst of 16 bits of data, for a total of 256 bits which may then be written into the memory array 118. In the x16 operation mode, when data is read, 256 bits may be read from the memory array 118 and then provided as 16 bursts of 16 bits each to the DQ pads. In another example, as part of an x8 operation mode, 8 different DQ pads may be used. Each of the DQ pads may still receive (or provide) bursts of 16 bits each, but the device may handle 128 bits as part of a single burst. In some embodiments, the device 100 may still read or write 256 bits at a time to the memory array 118, but may receive (or provide) it as part of two bursts of 128 bits each. While various embodiments will be discussed with reference to x16 and x8 modes of operation, it should be understood that these are intended as examples, and that the concepts and embodiments described herein are not limited to any particular number of DQ terminals, burst length, etc.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
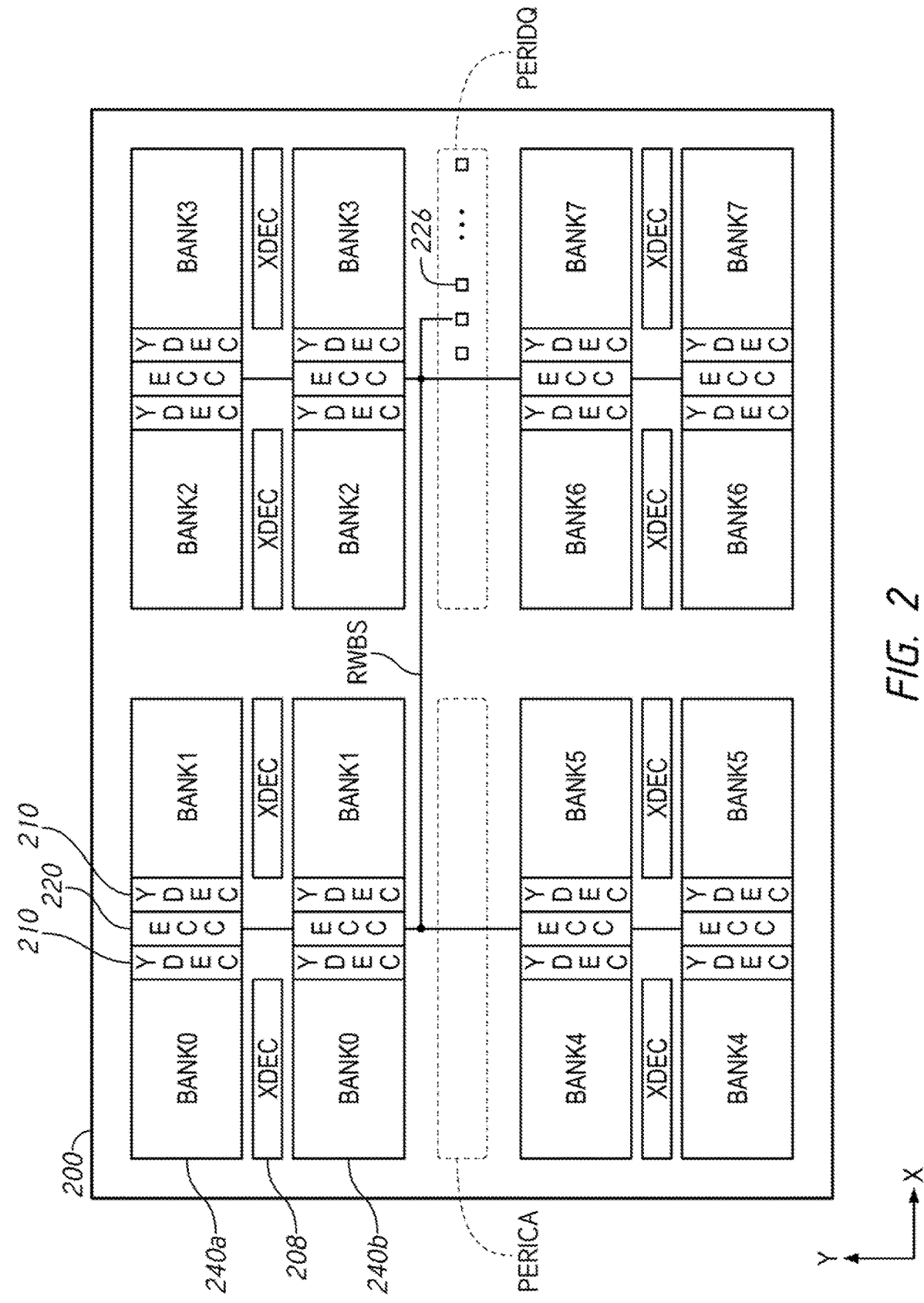
FIG. 2 is a block diagram of a memory device according to some embodiments of the present disclosure.

FIG. 2 is a block diagram of a memory device according to some embodiments of the present disclosure. The memory device 200 shows an example layout of certain components which are used as part of access operation in the memory 200. Other components may be omitted for the sake of clarity. The memory device 200 may in some embodiments, be included in the memory device 100 of FIG. 1.

The memory device 200 includes a number of banks 240, which are part of a memory array. The banks 240 may be divided into a first portion 240a of the bank and a second portion 240b of the bank, with a row decoder 208 positioned between the sections. The two sections of a given bank 240 and the row decoder 208 may be arranged along a first direction (e.g., a y-axis). Each bank 240 may be separated from another bank by a column decoder 210 associated with the first bank, an error correction region 220 and a column decoder 210 associated with the second band. The banks, column decoders 210, and error correction region 220 may be laid out along a second axis (e.g., an x-axis) which is orthogonal to the first axis. The banks of the memory 200 may be arranged in an array along the x-y plane.

There may be an error correction region 220 and column decoder 210 for each portion of a given bank 240. The error correction region 220 may be coupled to one or more DQ pads 226 (e.g., through an I/O circuit) to send and receive data outside the device 200. The DQ pads 226 (and I/O circuits etc.) may be located in a PERIDQ region between the memory banks 240, and other components of the memory 200 (e.g., the command address input circuit) may be located in a PERICA region between the memory banks 240.

The ECC region 220 includes one or more ECC control circuits used to correct the data bits which are stored in the memory banks 240 associated with that ECC region 220. For example, each ECC region 220 may include ECC control circuits which manage the portions of the banks on either side of that ECC region 220. For example a first ECC region 220 may be associated with the portion 240a and a second ECC region 220 may be associated with the portion 240b. In some embodiments, the ECC region 220 may include an ECC control circuit which corrects the data for either of the banks associated with that ECC region 220, depending on which of the banks is active. In some embodiments, the ECC region 220 may be extended (e.g., in the y direction) and may include one or more ECC control circuits which may manage both portions (e.g., 240a and 240b) of a bank.

Figure 3:
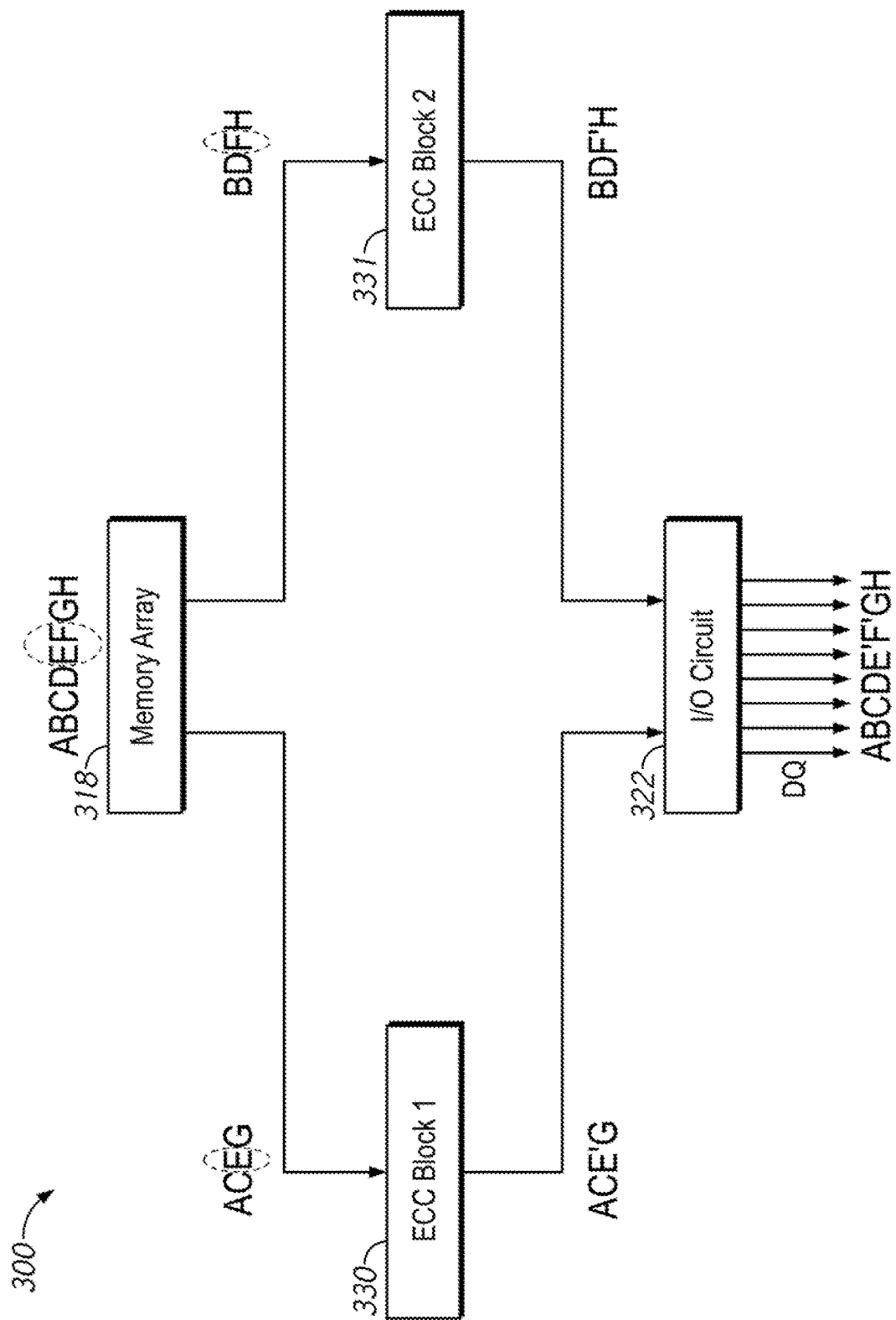
FIG. 3 is a block diagram of the operation of a memory device according to some embodiments of the present disclosure.

FIG. 3 is a block diagram of the operation of a memory device according to some embodiments of the present disclosure. The memory device 300 is a simplified view which shows how coupling non-adjacent memory cells to an ECC control circuit may be used to allow the device 300 to locate and correct errors in adjacent memory cells. The memory device 300 may, in some embodiments, represent the operation of a memory device such as the memory devices 100 of FIG. 1 and/or 200 of FIG. 2.

The device 300 includes a memory array 318, which includes a number of memory cells arranged along a word line. For clarity of explanation, the example of FIG. 3 shows a row which includes only eight memory cells, which provide eight bits of data, labelled A-H. Adjacent bits E and F have been circled to indicate that those bits include errors (e.g., the data of bits E and F do not match the state of the data which was written to those memory cells). For example, the adjacent bits may fail due to a manufacturing defect or short which extends across both memory cells. The row may also include parity bits (not shown) which are read out along with the bits A-H. While the example of FIG. 3 shows 8 bits of data, it should be understood that more or fewer bits may be used in other example embodiments. For example, in some embodiments, 128 or 256 bits of data may be read at a time out of the memory array 318 along with 8 or 16 parity bits.

In the example read operation shown in FIG. 3, adjacent bits read out from a row are provided to different ECC blocks 330 and 331, each of which may be an ECC control circuit (e.g., ECC control circuit 120 of FIG. 1) or may be a sub-component of a single ECC control circuit. Odd numbered bits (e.g., bits A, C, E, and G) may be provided to the first ECC block 330 along with any parity bits (not shown) associated with the odd bits. Even numbered bits (e.g., bits B, D, F, and H) may be provided to the second ECC block 331 along with any parity bits (not shown) associated with the even bits. Accordingly, the first and second ECC blocks 330 and 331 may each receive four bits, including one error bit. In this manner, the two adjacent error bits (e.g., F. and F) are split apart so that each of the two ECC blocks 330 and 331 receives only one error bit. The first ECC block 330 may use its received parity bit(s) to identify E as an error and correct it to corrected bit E', while the second ECC block 331 may use its received parity bit(s) to identify F as an error bit and correct it to corrected bit F'.

The read bits, including the two corrected bits, are then provided to the I/O circuit 322, which reassembles the bits into a sequence including the corrected bits (e.g., ABCDE'F'GH) and provides it to the DQ pads. In this manner, when the string of bits in the memory array 318 which includes two adjacent error bits is read, a string of bits with both errors corrected is provided to die DQ pads.

An example write operation may generally occur in reverse. For example, the bits ABCDEFH may be provided at a DQ terminal to the I/O circuit 322. The I/O circuit 322 may separate the data and provide bits ACEG to the first ECC block 330, while the bits BDFH are provided to the second ECC block 331. The first ECC block 330 may generate a parity bit based on the received bits ACEG and the second ECC block 331 may generate a second parity bit based on the received bits BDFH. The eight write bits and the two parity bits may then be written to the memory array 318.

In some embodiments, the bits may be read out from (or written to) the memory array 318 sequentially, rather than in parallel as shown. The different bits may be provided as part of different access operations (e.g., responsive to different read commands provided to the memory). For example, at a first time as part of a first read operation, the memory array 318 may provide the bits ACEG (and their associated parity bit) to the first ECC block 330. The first ECC block 330 may correct the read data to ACE'G and provide the corrected read data to the I/O circuit 322. At a second time as part of a second read operation, the memory array 318 may provide the bits BDFH (and their associated parity bit) to the first ECC block 330. The first ECC block 330 may correct the read data to BDF'H and provide the corrected read data to the I/O circuit 322.

Figure 4:
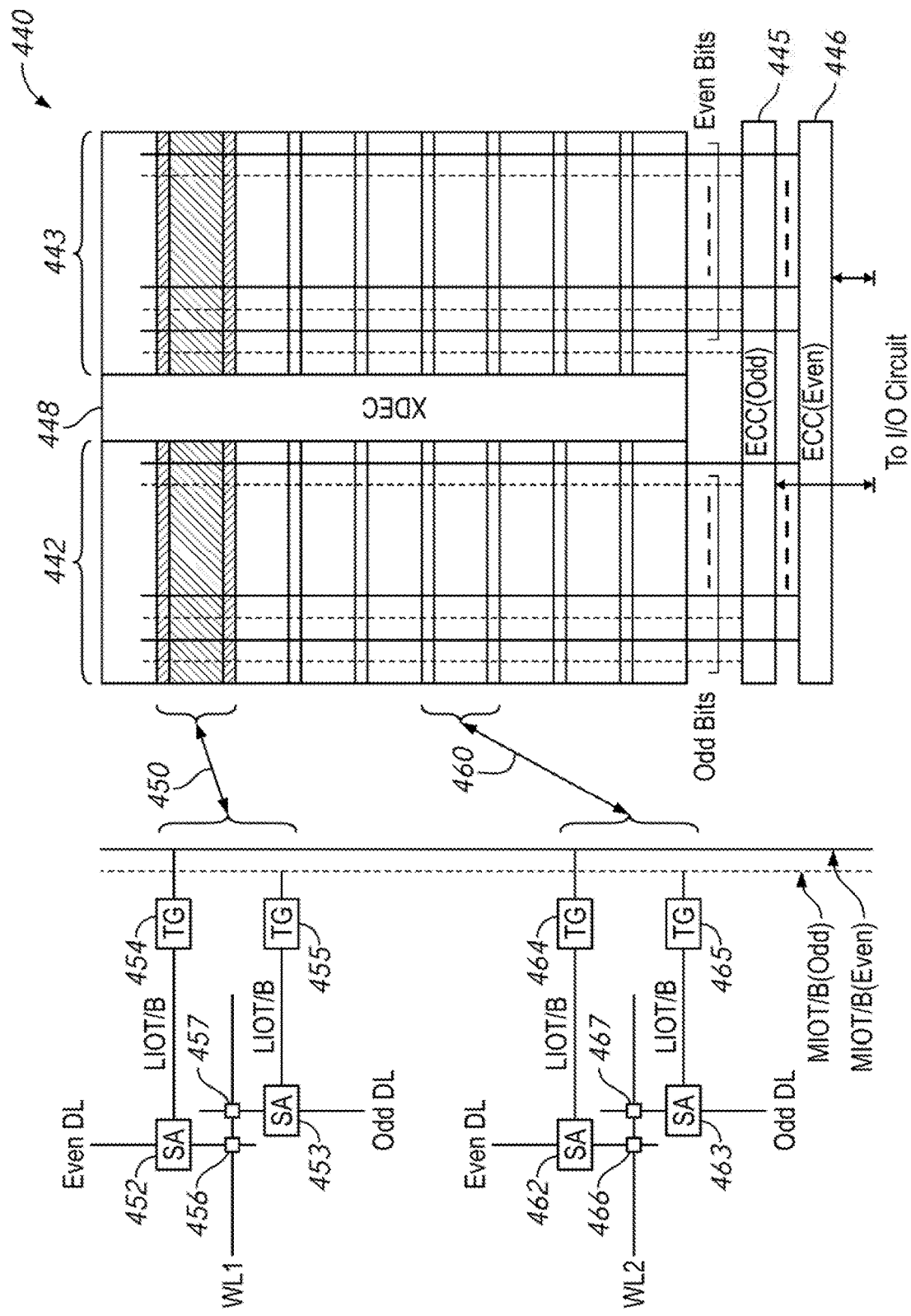
FIG. 4 is a schematic diagram of providing data from adjacent memory cells to different error correction circuits according to some embodiments of the present disclosure.

FIG. 4 is a schematic diagram of providing data from adjacent memory-cells to different error correction circuits according to some embodiments of the present disclosure. FIG. 4 shows a memory bank 440 which is coupled to a first ECC circuit 445 and a second ECC circuit 446. The memory bank 440 may, in some embodiments, be included in the memory array 118 of FIG. 1 and/or memory array 200 of FIG. 2. The error correction circuits 445 and 446 may, in some embodiments, be included in the ECC control circuit 120 of FIG. 1. FIG. 4 shows an embodiment where the memory operates in a mode (e.g., an x16 mode) where two ECC circuits 445 and 446 operate in parallel on a first set of data from non-adjacent memory cells and a second set of data from non-adjacent memory cells respectively.

The memory bank 440 is divided into a first bank portion 442 and a second bank portion 443. These may, in some embodiments, represent the bank portions 240a and 240b of FIG. 2. A row decoder 448 may be positioned between the first and the second bank section 442 and 443. As part of an access operation, the row decoder 448 may receive a row address and may activate one or more rows based on the row address. The activated row is shown as a shaded portion of the memory bank 440. In the example of FIG. 4, the activated row may include a first portion of the word line WL1 in the first portion 442 and a second portion of the word line WL1 in the second portion 443 of the memory bank 440.

Insets show a portion of a first row section 450 including a first wordline WL1 and a portion of a second row section 460 including a second wordline WL2. The first row section 450 includes a first wordline WL1 with a first memory cell 456 and a second memory cell 457 which is adjacent to the first memory cell. In other words, there is no other memory cell along the first wordline WL1 which is between the first memory cell 456 and second memory cell 457.

The first memory cell 456 is coupled by a first digit line (e.g., 'even DL') to a first sense amplifier 452 which is coupled by a local I/O line LIOT B to a first transfer gate 454, which in turn is coupled to a first main I/O line MIOT/B (e.g., an even MIOT/B line). The second memory cell 457 is coupled along a second digit line to a second sense amplifier 453, which is coupled by a second LIOT/B line to second transfer gate 455, which is coupled to a second MIOT/B line (e.g., an odd MIOT/B). The odd MIOT/B may be coupled to an odd ECC circuit 445, while the even MIOT/B may be coupled to an even ECC circuit 446. A first part of the first word line WL1 may extend across the first row section 450 in the first portion 442 and a second part of the first word line WL1 may extend across the first row section 450 in the second portion 443.

The second row section 460 may generally be similar to the first row section 450, and for the sake of brevity the features of the second row section 460 will not be repeated in detail again. The first memory cell 456 of the first row section 450 may, in some embodiments, be coupled to the same digit line as the first memory cell 466 of the second row section 460 and the second memory cell 457 of the first row section 450 may be coupled to the same digit line as the second memory cell 467 of the second row section 460.

The bank 440 may have a large number of memory cells along each wordline, which may be considered as alternating between odd and even numbered memory cells along the word line. Accordingly, the bank 440 may also have alternating even and odd digit lines, LIOT/B lines, and MIOT/B lines. For die sake of clarity in the figure, the even MIOT/B lines (coupled to even LIOT/B lines, even DLs, and even memory cells) are shown as solid lines, while odd MIOT/B lines (coupled to odd LIOT/B lines, odd DLs, and odd memory cells) are shown as dotted lines.

In the example read operation of the memory bank 440, the first wordline WL1 may be activated in both the first portion 442 and the second portion 443 of the bank 440. For example, a row address XADD which is associated with the first wordline WL1 may be issued by the row decoder 448 as part of the read operation. Focusing on the operation of the first and second memory cells 456 and 457, the activation of the first word line WL1 may cause data from these memory cells to be read out onto their respective LIOT/B lines by their respective sense amplifiers 452 and 453. The first transfer gate 454 may couple a first bit of data onto the even MIOT/B which may in turn provide the first bit of data from the first memory cell 456 to the even ECC circuit 446. The second transfer gate 457 may couple a second bit of data onto the odd MIOT/B which may in turn provide the second bit of data from the second memory cell 457 to the odd ECC circuit 445. In this manner the data from the adjacent memory cells 456 and 457 are provided to different ECC circuits.

For example, the first word line WL1 may include 128 bits of data and 8 parity bits in the first portion 442 and an additional 128 bits of data and 8 parity bits in the second portion 443. Accordingly, when a read operation is performed, 64 data bits and 4 parity bits are provided to even ECC circuit 446 from the first portion 442 and another 64 data bits and 4 parity bits are provided to the even ECC circuit 446 from the second portion 443. Thus, the even ECC circuit 446 may receive a total of 128 bits of data and 8 parity bits, but they may be spread across both portions of the bank 440. In a similar manner the odd ECC circuit 445 may also receive 128 bits of data and 8 parity bits spread across the two portions 442 and 443.

In this manner, each of the ECC circuits 445 and 446 may receive the same number of data and parity bits as they would if they were coupled to a single portion (e.g., 442 or 443) of the bank, but the bits received by each of the ECC circuits 445 and 446 are from non-adjacent memory cells. Accordingly, if there is an error in adjacent memory cells (e.g., both memory cell 456 and 457 store error bits) both bits may be identified and corrected, since the first error correction circuit 445 may correct the error bit provided by the odd memory cell 457 and the second error correction circuit 446 may correct the error bit provided by the even memory cell 456.

Figure 5:
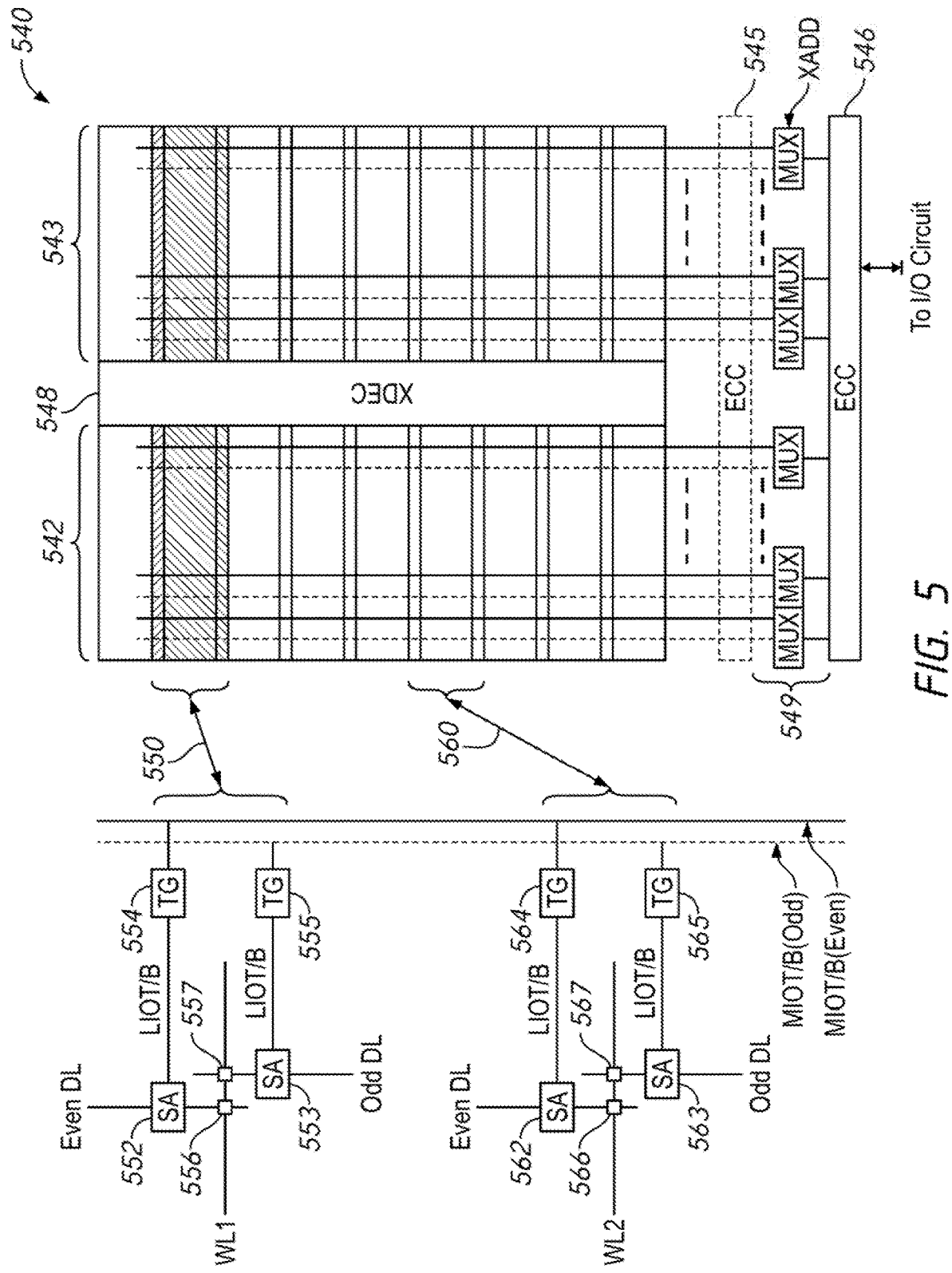
FIG. 5 is a schematic diagram of sequentially providing data from adjacent memory cells to an error correction circuit according to some embodiments of the present disclosure.

FIG. 5 is a schematic diagram of sequentially providing data from adjacent memory cells to an error correction circuit according to some embodiments of the present disclosure. The memory bank 540 and ECC circuits 545 and 546 of FIG. 5 may generally be similar to the memory bank 440 and ECC circuits 445 and 446 of FIG. 4. For the sake of brevity, components and operations similar to those described in FIG. 4 will not be described again with respect to FIG. 5.

In the embodiment of FIG. 5, a first set of information may be provided to an ECC circuit 546 at a first time as part of a first access operation, and a second set of information may be provided to the ECC circuit 546 at a second time as part of a second access operation. The first set of information may include bits of data and parity bits based on those bits of data. The second set of information may include bits of data and parity bits. The first set of information may come from memory cells which are not adjacent to each other, and the second set of information may come from memory cells which are not adjacent to each other. For example, the first set information may come from odd MIOT/B lines (e.g., odd memory cells such as 557) and the second set of information may come from the even MIOT/B lines (e.g., even memory cells such as 556). Multiplexer circuits 549 may selectively couple the even or odd MIOT/B lines to the ECC circuit 546. The multiplexer circuits 549 may switch based on the state of the row addresses provided along with the first and the second access operations.

The memory bank 540 may use the row address (e.g., XADD) to determine which digit lines are activated, and which state the multiplexer circuits 549 are in. For example, the memory bank 540 may use a most significant bit of the row address XADD to determine whether the even or odd digit lines are activated. The most significant bit of the row address XADD may also control whether the multiplexers couple the even or odd digit lines to the ECC circuit 546. In some embodiments, the row decoder 548 may provide a row-address with a first value of the most significant bit as part of the first access operation, to put the multiplexers 549 in a first state so that information may be read out from the first group of memory cells (e.g., the memory cells along the odd MIOT/B lines), and may provide the row address with a second value of the most significant bit as part of the second access operation to put the multiplexers 549 in a second state so that information may be read out from the second group of memory cells (e.g., the memory cells along the even MIOT/B lines). Since the first and the second access operations may be separated in time, the ECC circuit 546 may not receive the information from the first and the second group of memory cells at the same time.

In the example read operation of FIG. 5, the memory may operate in a different mode than the read operation described in FIG. 4. For example, the memory may be operating in an x16 mode in FIG. 4, and may operate in an x8 mode in FIG. 5. In some embodiments, a single memory device may be configurable to operate in the manner described in FIG. 4 or in the manner described in FIG. 5. For example, the memory may include ECC circuit 545 which is used for odd digit lines in an x16 mode (e.g., similar to FIG. 4) while the multiplexers 549 couple the even digit lines to the ECC circuit 546. In the x8 mode the multiplexers 549 may be used to switch between whether the ECC circuit 546 is coupled to the even or odd digit lines. In some embodiments, the memory may only operate in a mode where non-adjacent groups of information are provided to the ECC circuit 546 sequentially (e.g., only in the x8 mode) and the ECC circuit 545 may be omitted.

In some embodiments, the first and the second set of information may take advantage of the separation between the first portion 542 and the second portion 543. Since the row decoder 548 is positioned between the first portion and the second portion, a last digit line of the first portion 542 may not be considered adjacent to a first digit line of the second portion 543. Accordingly, in some embodiments, the first set of data which is read at a first time may include data read out along even digit lines of the first portion 542 and odd digit lines of the second portion 543, while the second set of data read at a second time may include data read out along odd digit lines of the first portion 542 and even digit lines of the second portion 543. Although different sets of digit lines are used in the first portion 542 and the second portion 543, no two adjacent memory cells are read out to the ECC circuit 546.

Figure 6:
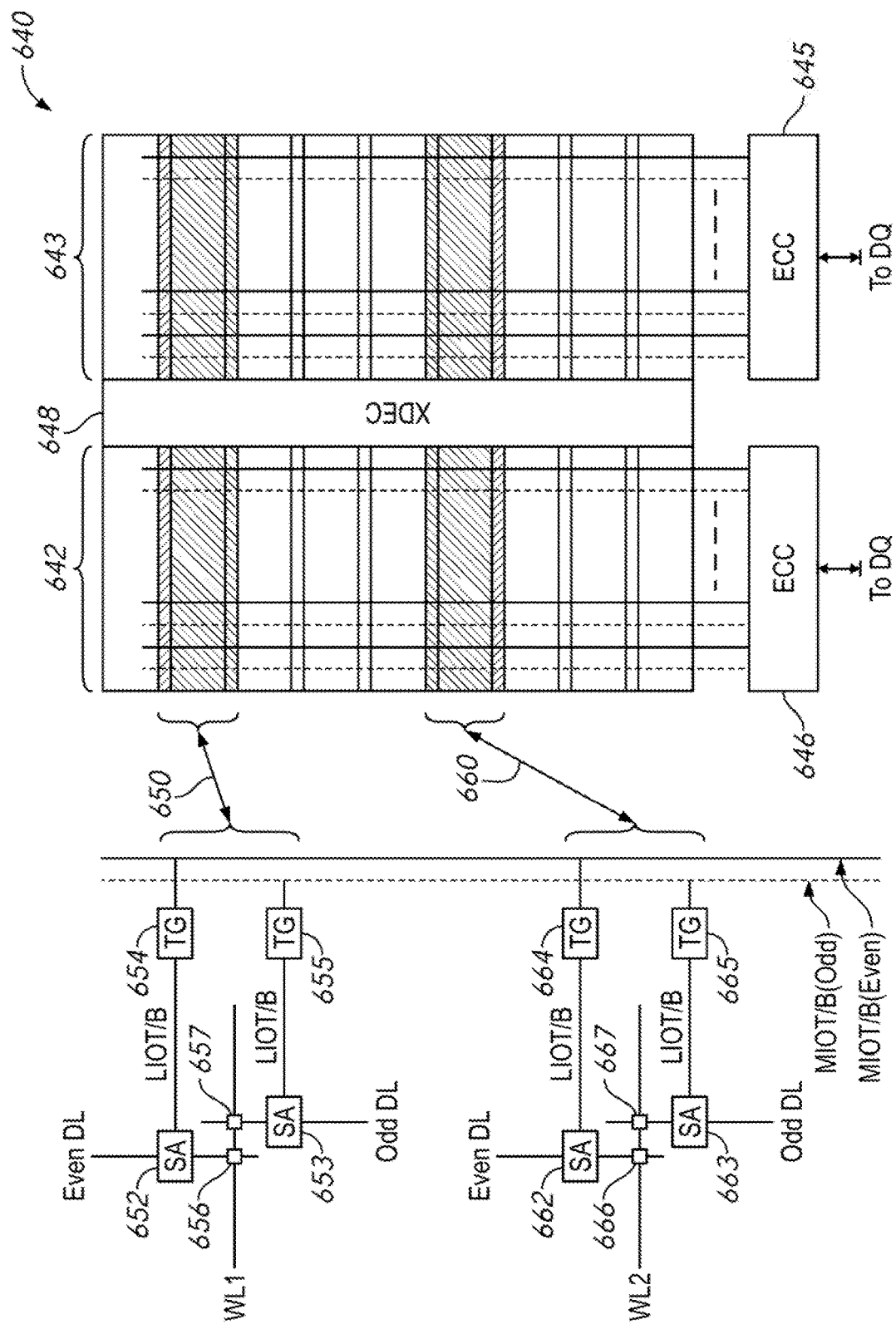
FIG. 6 is a schematic diagram of providing data from non-adjacent memory cells of different rows to an error correction circuit according to some embodiments of the present disclosure.

FIG. 6 is a schematic diagram of providing data from non-adjacent memory cells of different rows to an error correction circuit according to some embodiments of the present disclosure. The memory bank 640 may generally be similar to the memory banks 440 of FIG. 4 and 540 of FIG. 5. For the sake of brevity, components and operations of the memory bank 640 similar to components and operations previously described with respect to FIGS. 4 and/or 5 will not be repeated again.

In the embodiments of FIGS. 4 and 5, the ECC circuits (e.g., 445, 446, 545 and 546) may be coupled to both portions (e.g., 442/443 and 542/543) of the memory bank. This may increase the layout area that the ECC circuits need to cover. FIG. 6 shows a first ECC circuit 646 which is coupled to a first portion 642 of the bank 640 and a second ECC circuit 645 which is coupled to a second portion 643 of the bank 640. These ECC circuits 646 and 645 may have a reduced area on the memory device than the ECC circuit(s) of FIGS. 4 and 5.

The embodiment of FIG. 6 shows an example read operation where multiple row sections are activated in each portion of the bank 640. For example, the row decoder 648 may activate both the first word line WL1 in die first row section 650 and the second word line WL2 in the second row section 660. The even digit lines in one of the first row section 650 or the second row section 660 may be activated and the odd digit lines in the other row section may be activated. For example, even digit lines may be activated in the first row section 650 and odd digit lines may be activated in the second row section 660. The row address (e.g., a most significant bit of the row address) may be used to determine whether the even or odd digit lines are activated in each of the first and second row sections 650 and 660.

Accordingly, the first ECC circuit 646 may receive data (and parity bits) along even digit lines from the first row section 650 of die first portion 642 of the bank 640 and may receive data (and parity bits) along odd digit lines from the second row section 660 of the first portion 642 of the bank 640. Similarly, the second ECC circuit 645 may receive data (and parity bits) along even digit lines from the first row section 650 of the second portion 643 of the bank 640 and may receive data (and parity bits) along odd digit lines from the second row section 660 of the second portion 643 of the bank 640. In some embodiments, the activated word lines (e.g., WL1 and WL2) may also be non-adjacent to each other. For example, there may be at least one non-activated word line between the two activated word lines.

In an example embodiment, the bank 640 may be part of a memory device operating in an x16 operation mode. Accordingly, as part of a read operation, the first ECC circuit 646 may provide 128 corrected bits from the first portion 642 and the second ECC circuit 645 may provide 128 corrected bits from the second portion 643. The first ECC circuit 646 may receive 64 data bits and 4 parity bits from the first row section 650 of the first portion 642 and may receive an additional 64 data bits and 4 parity bits from the second row section 660 of the first portion 642. In this manner, the first ECC circuit 646 may receive a total of 128 data bits and 8 parity bits from memory cells which are not adjacent to each other. The first ECC circuit 646 may correct the 128 bits of data based on the 8 parity bits and provide the 128 corrected bits. In a similar manner, the second ECC circuit 645 may receive 128 data bits and 8 parity bits from non-adjacent memory cells in the two row sections of the second portion 643 and provide 128 corrected bits.

The memory device may alternate between accessing even and odd digit lines in the first and second activated word lines. For example, if as part of a first read operation information is read from even memory cells of the first word line WL1 and from odd memory cells of the second word line WL2, then in a second read operation information may be read from odd memory cells in the first word line WL1 and from even memory cells of the second word line WL2. In this manner, all of the memory cells along a given word line may be used, but adjacent memory cells may not be read out simultaneously to a single ECC circuit.

Figure 7:
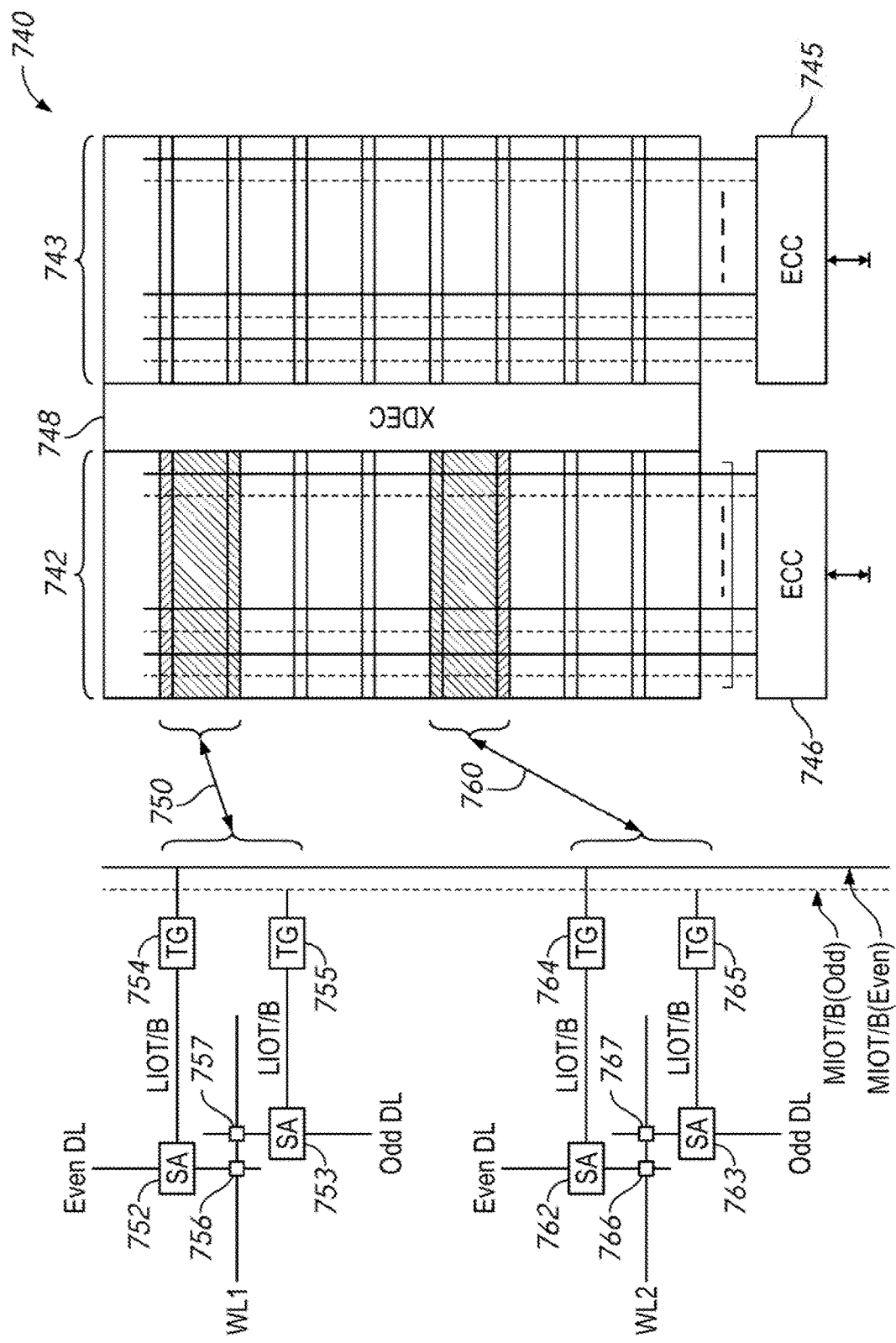
FIG. 7 is a schematic diagram of providing data from non-adjacent memory cells of different rows in a single bank section to an error correction circuit according to some embodiments of the present disclosure.

FIG. 7 is a schematic diagram of providing data from non-adjacent memory cells of different rows in a single bank section to an error correction circuit according to some embodiments of the present disclosure. The memory bank 740 of FIG. 7 may generally be similar to the memory banks 440 of FIG. 4, 540 of FIG. 5, and/or 640 of FIG. 6. For the sake of brevity, features and components previously described with respect to FIGS. 4-6 will not be repeated for FIG. 7.

The ECC circuits 746 and 745 may be similar to the ECC circuits 646 and 645 of FIG. 6 respectively. The first ECC circuit 746 may be coupled to a first portion 742 of the bank 740 while the second ECC circuit 7454 may be coupled to a second portion 743 of the bank 740. In the embodiment of FIG. 7, each of the two portions 742 and 743 may be activated separately. For example, the first portion 742 may be activated at a first time as part of a first access operation, and the first word line WL1 in the first row section 750 and the second word line WL2 in the second row section 760 may also both be activated. Bits of data (and parity bits) may be provided along even digit lines in the first section 750 and bits of data (and parity bits) may be provided along odd digit lines in the second section 760. At a second time (e.g., as part of a subsequent access operation), the second portion 743 may activate and bits may be provided to the second ECC circuit 745 in a similar fashion.

For example, the memory bank 740 may be operated in an x8 mode. As part of a read operation, the first and second wordline WL1 and WL2 may be activated in the first portion 742 of the bank 740. Even memory cells (e.g., 64 data bits and 4 parity bits) may be read out from the first word line WL1 and odd memory cells (e.g., 64 data bits and 4 parity bits) may be read out from the second word line WL2. Accordingly, the ECC circuit 746 may receive 128 data bits and 8 parity bits. The ECC circuit 746 may correct the 128 data bits based on the 8 parity bits, and provide 128 corrected bits to the I/O circuit.

Figure 8:
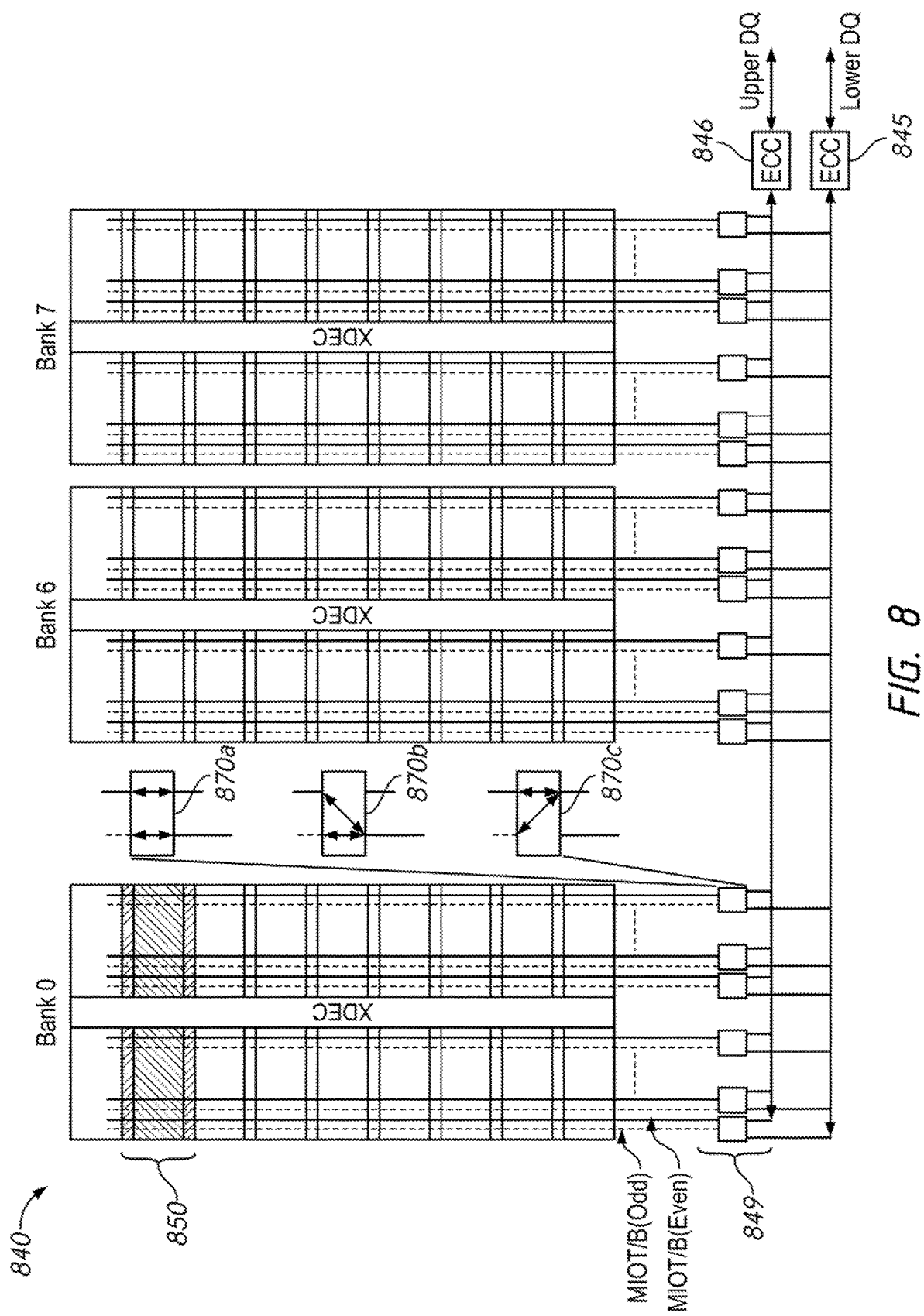
FIG. 8 is a schematic diagram of switches used to control the memory cells which provide data to one or more error correction circuits according to embodiments of the present disclosure.

FIG. 8 is a schematic diagram of switches used to control the memory cells which provide data to one or more error correction circuits according to embodiments of the present disclosure. FIG. 8 shows a number of memory banks 840 which are coupled in common to a first ECC circuit 846 and a second ECC circuit 845. The banks 840 and ECC circuits 845 and 846 of FIG. 8 may, in some embodiments, be similar to the banks 440-740 of FIGS. 4-7 and the ECC circuits 445-746 of FIGS. 4-7, For the sake of brevity, features and components of FIG. 8 similar to those described in FIGS. 4-7 will not be repeated again.

Each of the ECC circuits 846 and 845 may be associated with a different group of DQ pads. For example, the first ECC circuit 846 may be associated with an 'upper' group of DQ pads, while the second ECC circuit 845 may be associated with a 'lower' group of DQ pads. For example, the first ECC circuit 846 may be associated with eight DQ pads (e.g., DQ0 to DQ7) and the second ECC circuit 845 may be associated with a different group of eight DQ pads (e.g., DQ8 to DQ15). The banks 840 are coupled to the first ECC circuit 846 and second ECC circuit 845 by a number of switches 849. The switches 849 may act as multiplexers and may be used, in part, to determine which (if any) of the ECC circuits 846 and 845 even and odd digit lines of the memory banks 840 are coupled to. This may be used, in part, to manage ECC circuits in various operational modes.

For example, during an x16 operational mode, both the upper and lower DQ pads (e.g., all sixteen DQ pads DQ0 to DQ15) may be used by the memory device. Accordingly, in an x16 operational mode, all of the switches 849 may couple even digit lines to the first ECC circuit 846 and odd digit lines to the second ECC circuit 845 as shown in the inset 870a. In this manner, When a bank (e.g., Bank 0) is activated, and a row in that bank is activated, 128 data bits and 8 parity bits may be read out along the even digit lines to the first ECC circuit 846 which may in turn provide 128 corrected bits to the upper DQ pads, and another 128 data bits and 8 parity bits may be read out along the odd digit lines to the second ECC circuit 845 which may in turn provide 128 corrected bits to the lower DQ pads. Thus, the x16 mode operation represented by the inset 870a may generally be analogous to the operation described in FIG. 4.

In an example x8 operation mode, either the upper or lower DQ pads may be used. The inset 870b represents a configuration for the switches 849 for a lower x8 mode, where both the even and odd digit lines in a bank 840 may be coupled to the second ECC circuit 845. The inset 870c represents a configuration for the switches 849 for an upper x8 mode, where both the even and odd digit lines may be coupled to the first ECC circuit 846. In some embodiments, the switches 849 may act in a manner analogous to the multiplexers 549 of FIG. 5, and may couple either the even or odd digit line to the ECC circuit. For example, in an upper x8 mode, the first ECC circuit 846 may receive 64 data bits and 4 parity bits from even digit lines of an activated bank as part of a first access operation, and then receive 64 data bits and 4 parity bits from odd digit lines of the activated bank as part of a second access operation.

In some embodiments, different sets of digit lines may be read out, as long as each set docs not include digit lines coupled to memory cells which are directly adjacent to each other. For example, in some embodiments in an example lower x8 mode, all of the switches 849 coupled to a given bank may couple only even (or only odd) digit lines in a bank to the ECC circuit 845. In some embodiments, the switches 849 may use different groups of digit lines in different portions of the bank, as long as those portions are separated from each other (e.g., by a row decoder). For example, switches 849 coupled to a first portion of the bank may couple even digit lines to the ECC circuit 845, while switches 849 coupled to a second portion of the bank may couple odd digit lines to the ECC circuit 845.

Figure 9:
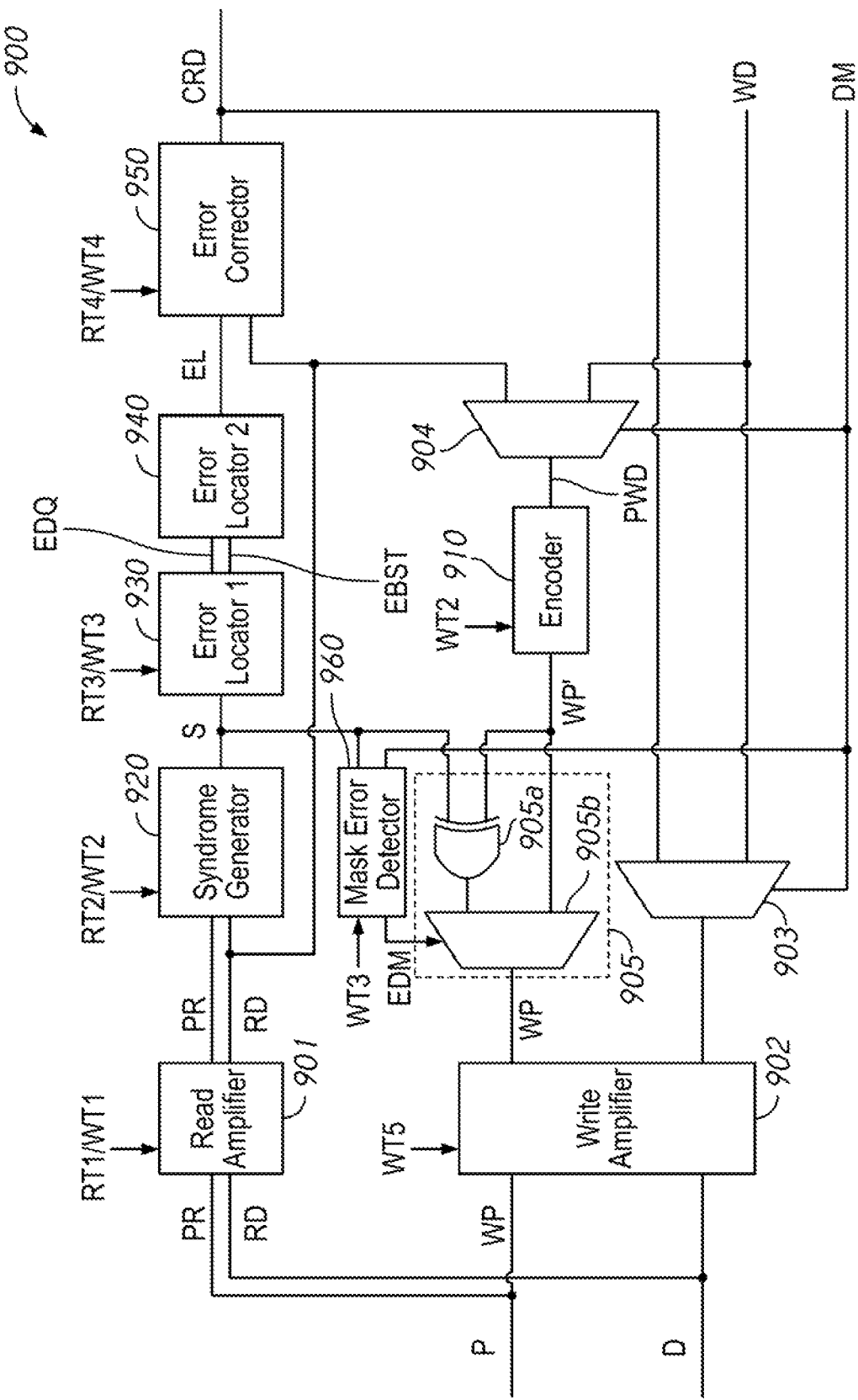
FIG. 9 is a schematic diagram of an error correction code (ECC) control circuit according to some embodiments of the present disclosure.

FIG. 9 is a schematic diagram of an error correction code (ECC) control circuit according to some embodiments of the present disclosure. The ECC control circuit 900 of FIG. 9 may, in some embodiments, be included in one or more of the ECC circuits of FIGS. 1-8 (e.g., 120 of FIG. 1, 220 of FIG. 2, 330/331 of FIG. 3, 445/446 of FIG. 4, etc.). The ECC control circuit 900 may receive write data bits WD and may generate written parity bits WP. These may be provided to the memory array as data bits D and parity bits P. The ECC control circuit 900 may receive data D from the memory array as read data RD and parity bits P as read parity bits PR and may generate corrected data bits CRD based on the bits RD and PR.

During an example read operation, the read amplifier 901 is activated in response to the timing signal RT1 to amplify the read parity bits PR and read data RD. The amplified bits PR and RD are provided to a syndrome generator circuit 920, which is activated in response to a timing signal RT2, which activates at a time after RT1 is active. The syndrome generator 920 provides syndrome bits S based on the read bits RD and PR. In some embodiments, the number of syndrome bits S may match the number of parity bits PR. The syndrome bits S are provided to an error locator circuit 930.

The error locator circuit 930 provides a first set of error determination signals EBST and a second set of error determination bits EDQ based, in part, on the syndrome bits S. The error locator circuit 930 may activate responsive to a timing signal RT3, which may activate after the signal RT2. As previously discussed, data provided to received at the DQ terminals may be organized into bursts on a number of different DO terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to an error locator circuit 940. The error locator circuit 940 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error position signal EL is provided to error corrector circuit 950. The error corrector circuit 950 also receives the read data RD and corrects one or more error bits in the RD based on the error location signal EL. For example, if an nth bit of the error location signal EL is at a high logical level, then the error corrector circuit 950 may change a state of the nth read bit RD. The error corrector circuit 950 may provide the corrected read data CRD. The error corrector circuit 950 may be activated in response to the timing signal RT4, which may be activated after the signal RT3. The corrected read data CRD may be provided to the DQ pads and read off of the device.

In an example write operation to the memory device, the ECC control circuit 900 may receive write data WD and a data mask signal DM. A first multiplexer 903 may synthesize the write data WD and the corrected read data CRD based on the data mask signal DM. The first multiplexer 903 may provide the data D, which is written to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

A second multiplexer 904 may synthesize the write data WD and the read data RD based on the data mask signal. The second multiplexer 904 may provide parity write data PWD. The parity write data PWD may be provided to an encoder circuit 910, which may encode the parity data PWD into the write parities WP'. The write parities WP' are provided to a converter circuit 905 which generates the write parities WP, which are written to the memory array as the parity bits P.

The converter circuit 905 includes an XOR logic gate 905a and a third multiplexer 905b. The XOR logic gate 905a has input terminals coupled to the syndrome bits S and the write parity bits WP'. The XOR logic gate 905a provides an output which is at a high logical level when the syndrome bite S is different from the associated write parity bit WP'. The third multiplexer 905b provides either the output of the XOR logic gate 905a or the write parity WP' as the write parity WP The multiplexer 905b choses the source of the write parity WP bits based on a conversion signal EDM. When the conversion signal EDM is active, the write parity WP is the output of the XOR gate 905a. When the conversion signal EDM is inactive, the signal WP' is provided as the signal WP.

A mask error detector circuit 960 provides the signal EDM based on the syndrome bits S and on the data mask DM. The mask error detector circuit 960 may determine whether or not burst data to which an error bit belongs and burst data masked by the data mask signal DM are coincident. If they are coincident, then the signal EDM may be activated. If they are not coincident, the signal EDM may remain inactive.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a memory bank comprising a plurality of memory cells disposed along a word line, wherein each of the plurality of memory cells is configured to store one of a plurality of bits of information;
   an error code correction (ECC) circuit configured to receive a first group of bits as part of a first read operation and a second group of bits as part of a second read operation, wherein the first group of bits are associated with ones of the plurality of memory cells which are not adjacent other memory cells associated with the first group, and the second group of bits are associated with ones of the plurality of memory cells which are not adjacent to other memory cells associated with the second group; and
   a plurality of multiplexers configured to selectively couple the ECC circuit to even numbered ones of the memory cells or odd numbered ones of the memory cells.

2. The apparatus of claim 1, wherein the plurality of multiplexers are configured to switch based on a row address provided as part of an access operation.

3. The apparatus of claim 1, wherein as part of a first write operation the ECC circuit is configured to receive write data, generate parity bits based on the write data and provide a first portion of the write data and parity bits and wherein as part of a second write operation the ECC circuit is configured to receive write data, generate parity bits based on the write data and provide a second portion of the write data and parity bits.

4. The apparatus of claim 3, wherein the first portion is provided to a first group of the plurality of memory cells and the second portion is provided to a second group of the plurality of memory cells, wherein memory cells of the first group are not adjacent to other memory cells of the first group and wherein memory cells of the second group are not adjacent to memory cells of the second group.

5. An apparatus comprising:
   a memory bank comprising a plurality of memory cells disposed along a word line, wherein each of the plurality of memory cells is configured to store one of a plurality of bits of information;
      an error code correction (ECC) circuit configured to receive a first group of bits as part of a first read operation and a second group of bits as part of a second read operation, wherein the first group of bits are associated with ones of the plurality of memory cells which are not adjacent other memory cells associated with the first group, and the second group of bits are associated with ones of the plurality of memory cells which are not adjacent to other memory cells associated with the second group, and wherein the first group of bits are provided along odd ones of a plurality of digit lines and wherein the second group of bits are provided along even ones of the plurality of digit lines.

6. An apparatus comprising:
   a memory bank comprising a plurality of memory cells disposed along a word line, wherein each of the plurality of memory cells is configured to store one of a plurality of bits of information;
      an error code correction (ECC) circuit configured to receive a first group of bits as part of a first read operation and a second group of bits as part of a second read operation, wherein the first group of bits are associated with ones of the plurality of memory cells which are not adjacent other memory cells associated with the first group, and the second group of bits are associated with ones of the plurality of memory cells which are not adjacent to other memory cells associated with the second group; and
      a row decoder, wherein the memory array comprises a first portion and a second portion with the row decoder in between and wherein the ECC circuit is coupled to the first portion and the second portion of the memory array.

7. An apparatus comprising:
   a memory bank comprising:
      a first word line;
      a second word line; and
      a plurality of digit lines each intersecting the first word line and the second word line; and
   an error code correction (ECC) circuit coupled to the plurality of digit lines, wherein the ECC circuit is configured to receive a first plurality of bits of information from the first word line provided along even numbered ones of the plurality of digit lines and configured to receive a second plurality of bits of information from the second word line provided along odd numbered ones of the plurality of digit lines as part of a read operation.

8. The apparatus of claim 7, wherein the memory bank further comprises:
   a first portion including a first portion of the first wordline and a first portion of the second word line; and
   a second portion including a first portion of the second word line and a second portion of the second word line.

9. The apparatus of claim 8, further comprising a second ECC circuit, wherein the ECC circuit is coupled to the first portion of the first word line and the first portion of the second word line and wherein the second ECC circuit is coupled to the second portion of the first word line and the second portion of the second word line.

10. The apparatus of claim 9, wherein in a first mode the first portion and the second portion of the first and the second word line provide the information, and wherein in a second mode the first portion or the second portion of the first and the second wordline provide the information.

11. The apparatus of claim 8, further comprising a row decoder positioned between the first portion and the second portion of the memory bank.

12. The apparatus of claim 7, wherein the first plurality of and the second plurality of bits of information includes a plurality of data bits and a plurality of parity bits and wherein the ECC circuit is configured to locate and correct errors in the plurality of data bits based on the plurality of parity bits.

13. The apparatus of claim 7, wherein the ECC circuit is configured to provide the first plurality of bits of information to the first wordline along even numbered ones of the plurality of digit lines and to provide the second plurality of bits of information to the second wordline along odd numbered ones of the plurality of digit lines as part of a write operation.

14. An apparatus comprising:
   a memory array comprising a plurality of memory cells disposed at the intersections of a plurality of word lines and a plurality of digit lines;
   a first error code correction (ECC) circuit; and
   a plurality of switches, wherein each of the plurality of switches is coupled to an adjacent pair of the plurality of digit lines, and wherein each of the plurality of switches is configured to selectively couple an even one of the adjacent pair or an odd one of the adjacent pair to the first ECC circuit.

15. The apparatus of claim 14, wherein the plurality of switches are configured to selectively couple the even or the odd one of the plurality of digit lines based on a row address.

16. The apparatus of claim 14, further comprising a second ECC circuit, wherein the plurality of switches are configured to couple the even one to the first ECC circuit and the odd one to the second ECC circuit in a first mode, and to couple either the even one or the odd one to one of the first ECC circuit or the second ECC circuit in a second mode.

17. The apparatus of claim 16, wherein the first ECC circuit is coupled to a first portion of a plurality of data terminals and the second ECC circuit is coupled to a second portion of the plurality of data terminals.

18. The apparatus of claim 17, wherein the first mode includes sending and receiving data along the first portion and the second portion of the plurality of data terminals, and wherein the second mode includes sending and receiving data along the first portion or the second portion of the plurality of data terminals.

19. The apparatus of claim 14, wherein the memory array comprises a plurality of memory banks, each coupled to the first ECC circuit.

20. The apparatus of claim 14, further comprising a plurality of ECC circuits, wherein the memory array comprises a plurality of memory banks, and wherein each of the plurality of ECC circuits is associated with one of the plurality of memory banks.

\* \* \* \* \*